United States Patent [19]

Madan et al.

[11] Patent Number: 4,763,602
[45] Date of Patent: Aug. 16, 1988

[54] THIN FILM DEPOSITION APPARATUS INCLUDING A VACUUM TRANSPORT MECHANISM

[75] Inventors: Arun Madan, Golden; Bolko Von Roedern, Wheat Ridge, both of Colo.

[73] Assignee: Glasstech Solar, Inc., Perrysburg, Ohio

[21] Appl. No.: 18,617

[22] Filed: Feb. 25, 1987

[51] Int. Cl.$^4$ .................. C23C 14/00; C23C 16/00
[52] U.S. Cl. ................................. 118/719; 118/715; 118/723; 118/733; 204/298; 414/217
[58] Field of Search ............. 118/715, 719, 723, 733; 204/298; 414/217

[56] References Cited

U.S. PATENT DOCUMENTS

| | | | |
|---|---|---|---|
| 4,498,416 | 2/1985 | Bouchaib | 118/719 |
| 4,592,306 | 6/1986 | Gallego | 118/719 |
| 4,666,734 | 5/1987 | Kamiya | 118/719 |
| 4,674,434 | 6/1987 | Ishihara | 118/719 |

*Primary Examiner*—Richard Bueker
*Attorney, Agent, or Firm*—Brooks & Kushman

[57] ABSTRACT

An apparatus for depositing thin films on a substrate includes at least one deposition module, a load lock module, a gate valve and a transportation mechanism for moving a substrate between the load lock and the at least one deposition module, the transportation mechanism being adapted to operate within ultra high vacuum conditions. The at least one deposition module is capable of maintaining an ultra high vacuum for depositing materials from reactive gases contained therein on a substrate. The load lock module is connected to the at least one deposition module by a gate valve and is capable of maintaining an ultra high vacuum. The transportation mechanism for moving the substrate between the load lock and the at least one deposition module is adapted to operate under ultra high vacuum conditions so that the substrate can be drawn from the load lock into the deposition module without breaking vacuum in the deposition module and contaminating the reactive gases contained therein. The apparatus is especially useful for manufacturing solar cells formed from doped amorphous silicon deposited from a glow discharge.

18 Claims, 6 Drawing Sheets

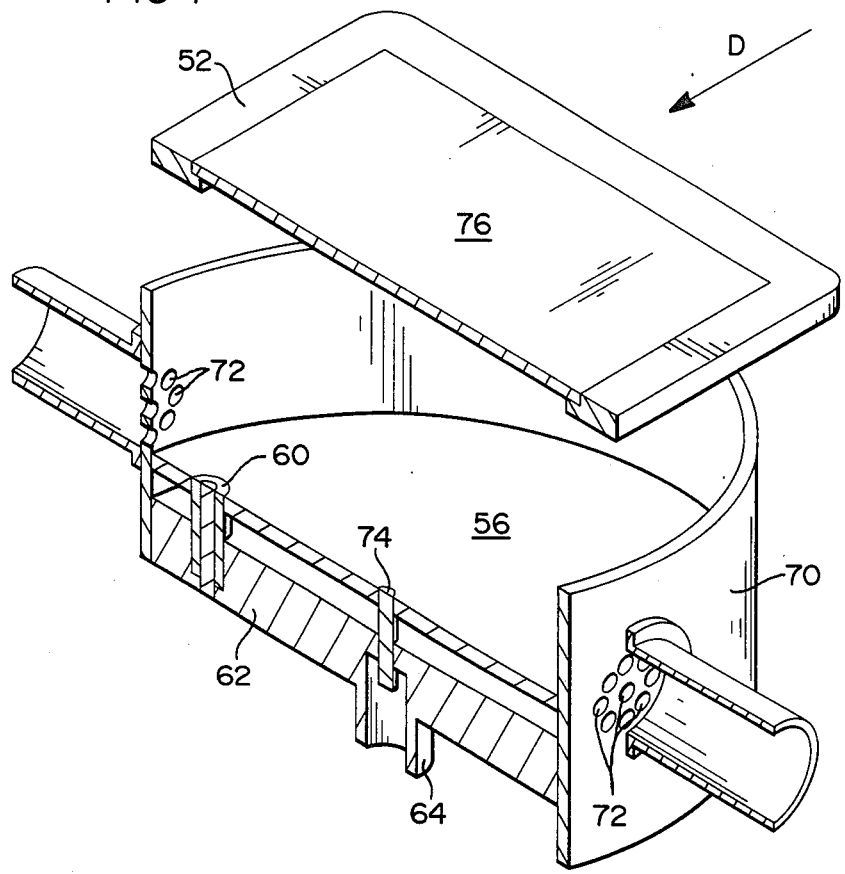

4,763,602

THIN FILM DEPOSITION APPARATUS INCLUDING A VACUUM TRANSPORT MECHANISM

TECHNICAL FIELD

This invention relates to an apparatus including a transport system under vacuum for depositing thin films of materials onto substrates.

BACKGROUND ART

In recent history, thin film coatings on substrates have been used for many purposes, including the production of thin film semicondutors. Apparatus and methods for the deposition of thin films of semiconductor and insulating materials for the fabrication of semiconductor devices generally involve high vacuum depositions. Conventional glow discharge depositions include the decomposition of at least one reactive gas to produce the thin films. The decomposition may be activated in one of many ways. The most common way includes the use of a pair of electrodes having a potential applied therebetween, either electrode facing opposite surfaces of the substrate. A reactive gas, such as silane, is activated by an rf frequency generator to initiate a glow discharge in the region between the electrodes, resulting in a deposition of a thin film of material on the surface of the substrate. In the silane example, various dopants may be introduced into the reactive gas to produce desired conductivity types of amorphous silicon thin films.

Commonly, amorphous silicon photovoltaic cells are produced by depositing sequential layers of P-type material, intrinsic material, and N-type materials. Other types of manufactured semiconductors utilize PN configurations and oxides, nitrides and other thin films. For the production of successful devices, it is imperative to minimize cross-contamination between each layer deposited. In certain deposition apparatus, the substrate is placed within the deposition housing, the atmosphere is evacuated to a pressure less than $10^{-7}$ torr, and the gas corresponding to the desired material is introduced into the deposition housing. A plasma is thereafter initiated, the deposition occurs, and the reactive gas is evacuated before the next gas is introduced. Residual gases not pumped out of the system before the next gas is introduced contaminate the material layer deposited thereafter.

One of the most plaguing problems in the production of semiconductors is contamination of the materials due to the presence of contaminants in the deposition chamber during the deposition process. These problematic contaminants come from various sources: (1) nonexhausted gases; (2) leaks around the seals and transportation mechanisms; (3) lubricants used within the deposition chamber; (4) heater elements, as well as other origins. Previous attempts to solve the contamination problem have included the use of a load lock chamber with a gate valve to separate the load lock from the deposition chamber to which it is connected. Furthering the problem, however, some systems include transportation mechanisms located outside the vacuum. In these outside systems, the transportation mechanisms reaching into the deposition chamber are likely to have leaks surrounding the point of entry. Lubricants outgas into the systems and dope the semiconductor layers, generally with carbon compounds.

Further, previous systems have included heater elements within the deposition chamber. Due to its location, the heater element may outgas and create contamination problems. To combat this outgasing problem, expensive heater elements which do not outgas have been utilized to prevent contamination of the material layers.

Another plaguing problem in the production of semiconductors is a lack of uniformity in the deposition of the semiconductor material layers themselves. Many different methods have been proposed to minimize nonuniformity problems including introducing the reactive gases used in the deposition system from various angles, the utilization of gas curtains and the like, and metering apparatus for the careful introduction of reactive gases at certain rates.

The configuration of the deposition chamber itself in previous systems has unfortunately been limited to gas-specific applications. It would be advantageous for a deposition system to exhibit a capacity for depositing many different types of gases to permit the deposition system to be used in many different ways. Prior art systems, although technically are available for use in the deposition of various coatings, are not adjustable to obtain optimum results when introducing new and different reactive gases. The anode-cathode separation distance is essentially gas-specific.

Transportation systems in prior art multi-layer coating mechanisms have included many different devices including axially rotated positioning means, small automated rail car systems, push rod mechanisms, and web transportation means. Many other transportation systems have been attempted. Some transportation systems are located outside the deposition chamber, inserting the substrate into the deposition chamber in each instance. All of the above-mentioned methods have problems that accompany each one. An efficient, clean, inexpensive transportation mechanism is desirable to solve these problems.

DISCLOSURE OF THE INVENTION

An object of the present invention is to provide an improved thin-film deposition apparatus, including a vacuum transport mechanism. The apparatus for depositing thin films comprises at least one deposition module capable of maintaining an ultra-high vacuum for depositing materials from reactive gases contained therein onto a substrate. A load lock module which is also capable of maintaining an ultra-high vacuum is connected to the deposition module, and a gate valve is located between the deposition module and the load lock module to allow the substrate to move from the load lock into the deposition module while minimizing contamination of the reactive gases in either module.

The transportation mechanism has a transport shaft and a substrate carrier for moving the substrate between the load lock and the deposition module. The transportation mechanism extends outwardly from the deposition module on the side opposite the load lock, whereby the transportation shaft located therein reaches through the deposition module into the load lock and pulls the substrate back into the deposition module. The transportation mechanism is adapted to operate under ultra-high vacuum conditions so that the substrate can be moved from the load lock into the deposition module without breaking vacuum in the deposition module and ccntaminating the reactive gases contained therein. Up to four deposition modules may be included if each is perpendicular to the other and extends outwardly from the load lock module. In this event, a gate valve will be further included in association with each of the deposition modules.

The deposition modules may be glow discharge chambers which decompose reactive gases contained therein to deposit a material layer on the surface of the substrate. The apparatus is specifically described as being embodied by a deposition module which may be interchanged with other modules due to its specific configuration.

An apparatus in accordance with the present invention having three deposition chambers is most useful for the application of three layer depositions in which the materials deposited are P-type, intrinsic and N-type amorphous silicon coatings. These thin-film coatings may manufacture a photovoltaic device, a thin-film transistor, or any other type of semiconductor device.

A further object of the present invention is to provide an apparatus for depositing thin-film coatings on a substrate while substantially preventing cross-contamination between deposition chambers and the load lock module, and between individual deposition modules. According to a preferred embodiment of the invention, the transport mechanism is utilized to draw a substrate in a substrate carrier on a transport rail from the load lock module to the deposition module. Contamination is minimized due to the load lock and gate valve design.

A heating element is located outside the vacuum portion of the deposition module and is separated from the vacuum portion of the deposition module by an insulator. The heating element heats by conduction due to proximity of the substrate when it is in position within the deposition module. Locating the heating element outside the deposition module alleviates the need for expensive heating elements which exhibit minimized outgasing. Consequently, an economical element may be utilized, and replacement can be achieved without taking apart the deposition module itself.

Non-uniformity problems are substantially reduced by the present invention due to the use of a dark space shield having evenly spaced gas diffuser openings on opposite sides of the shield to urge a preselected pattern of the reactive gases therethrough. The gases are fed into the module and diffuse therethrough. This prevents jet action and overcomes non-uniformity problems because the reactive gases are depleted uniformly across the surface of the substrate. The dark space shield includes up to 20 evenly spaced circular gas diffuser openings having diameters of from about 0.05 inches to about 0.6 inches in the wall of the dark space shield. Gas diffuser openings are located on opposite sides of the deposition module proximate the ingress and egress positions for the reactive gases to urge the flowing of gas across the surface of the substrate in a preselected pattern perpendicular to the direction of travel of the substrate so that a uniform deposition of a material layer is accomplished.

Another aspect of the present invention ensures greater reproducibility of semiconductors. The inclusion of a variable height RF electrode pedestal is adapted to allow for a variable distance between the anode and the cathode within the deposition module. The distance between the anode and cathode may be optimized for the particular reactive gas to be utilized. The RF pedestal design ensures that the power delivered is entirely directed to the plasma region between the electrodes. Consequently, reproducibility is enhanced due to this adjustable feature.

The RF electrode pedestal further includes vacuum-compatible co-axial connectors and cables which readily adapt to the variable distances between the anode and the cathode.

In the preferred embodiment, the transportation mechanism includes an ultra-high vacuum compatible bellows which surrounds and seals a transport rail supporting a substrate carrier connectable to the transport shaft. These components are held within the bellows under vacuum conditions for transporting the substrate along the transport rail between the load lock and the deposition module while remaining under vacuum. A motor-driven gear drive means or a manually operated means may be provided for moving the transport shaft into and out of the load lock module into the deposition module. Further details of the transportation mechanism will be described in more detail hereinbelow.

The apparatus is specifically described as being embodied by a first, second and third deposition module adapted for glow discharge deposition of P-type, intrinsic and N-type amorphous silicon materials, respectively, a central load lock module capable of maintaining an ultrahigh vacuum connected to all the deposition modules, and respective gate valves between each deposition module and the load lock to minimize cross-contamination.

Bellows-sealed, manually operated transportation mechanisms for moving the substrate between the central load lock and the respective deposition modules are adapted to operate under ultra-high vacuum conditions. A transportation shaft located therein reaches through deposition modules into the central load lock to pull the substrate back into the deposition module. While this apparatus is ideally suited for the production of amorphous silicon photovoltaic devices having a P-I-N-type configuration, it should be understood that the material layers can also be used in other semiconductor applications. For example, thin-film transistors may be produced by depositing various amorphous silicon layers, silicon nitride and various oxides. Moreover, any practical thin-film coating desired by the practitioner can advantageously be produced by the apparatus embodied in the invention.

The objects, features, and advantages of the present invention are readily apparent from the following detailed description of the best modes for carrying out the invention when taken in connection with the accompanying drawings.

BRIEF DESCRIPTION OF THE DRAWINGS

FIG. 7 is a perspective sectional view of the RF electrode pedestal and dark space shield.

BEST MODE FOR CARRYING OUT THE INVENTION

Figure 1:
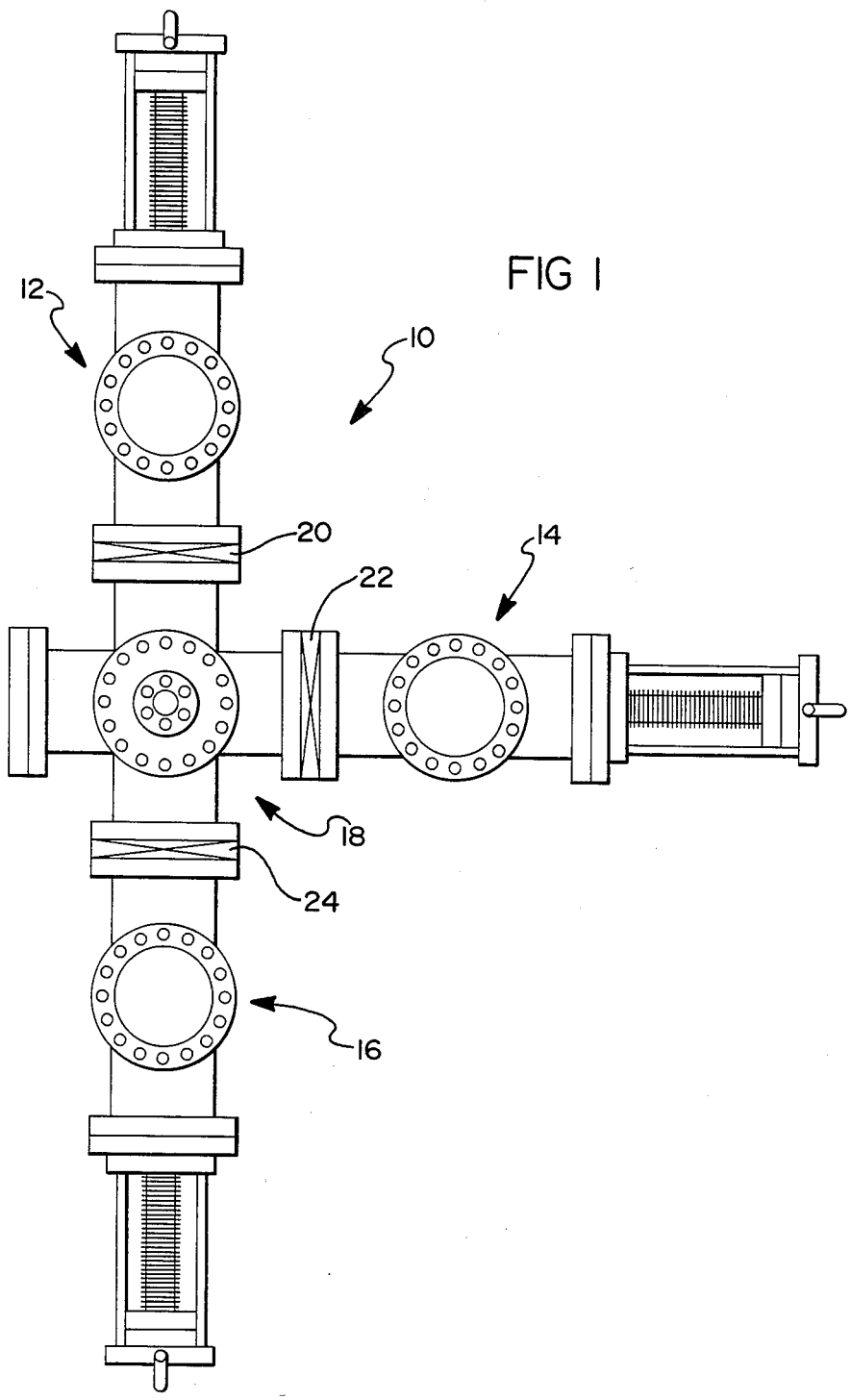
FIG. 1 is a top view of a thin-film deposition apparatus whose vacuum transport mechanism is constructed in accordance with the present invention.

Referring now to FIG. 1 of the drawings, a thin-film deposition apparatus, collectively indicated by reference numeral 10, includes a first, second and third deposition module 12, 14 and 16 in which substrates are transported to have thin films deposited thereon. A load lock module 18 is isolated from the deposition modules 12, 14 and 16 by respective gate valves 20, 22 and 24. As is more fully hereinafter described, transportation mechanisms are associated with each of the three deposition modules to transport substrates from load lock module 18 into deposition modules 12, 14 and 16. It must be understood that any number of deposition modules may be attached to the load lock modules. If more than one load lock is to be utilized, a commensurate number of deposition modules may also be used.

Figure 2:
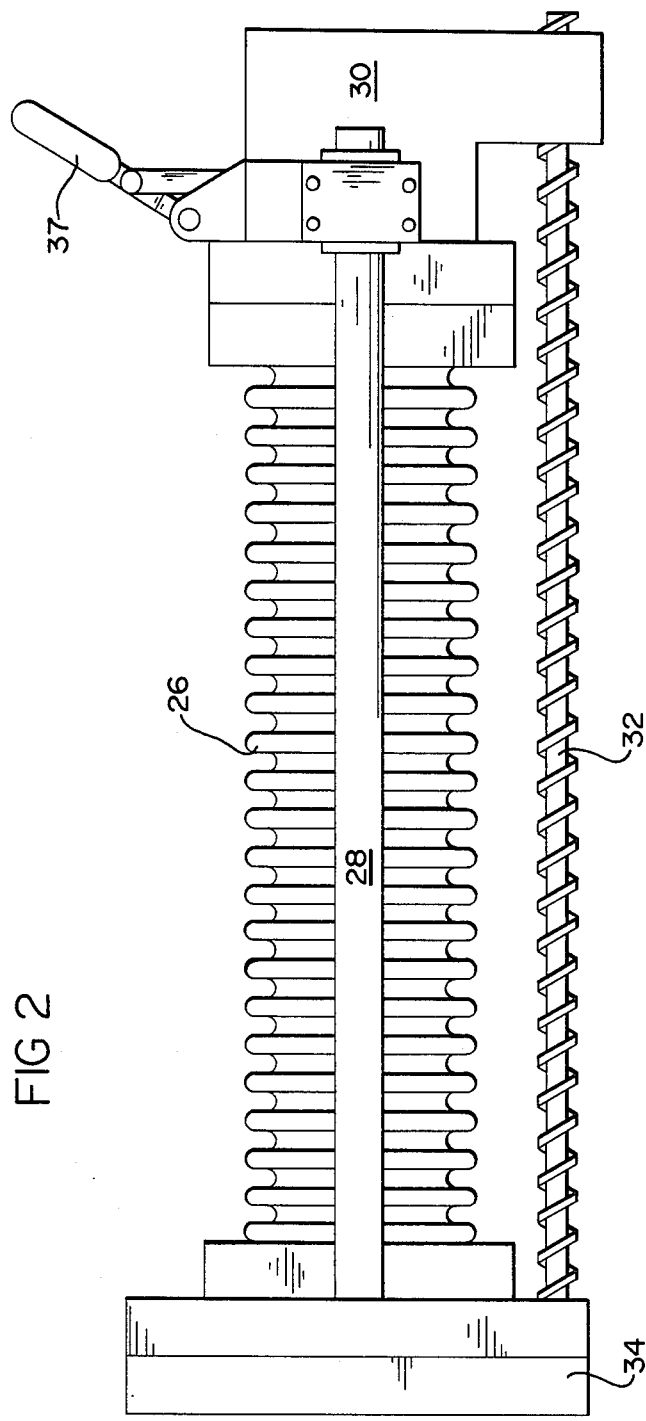
FIG. 2 is a side view of the bellow-sealed portion of the transport mechanism.

Referring to FIG. 2, the transportation mechanism is shown in greater detail. Bellows 26 is vacuum-welded and capable of working under ultra-high vacuum conditions, including pressures less than or equal to about $10^{-7}$ torr. A transport rail 28 is located to the side of bellows 26 and acts as a support and guide for transport mechanism end piece 30. End piece 30 is set in motion by gear 32 along transport rail 28. As end piece 30 is guided along transport rail 28 toward gate valve 34, bellows 26 collapses in an accordion-like fashion. End piece 30 may be driven along gear 32 manually or may be attached to a motor which is numerically controlled by a computer (not shown).

Figure 3:
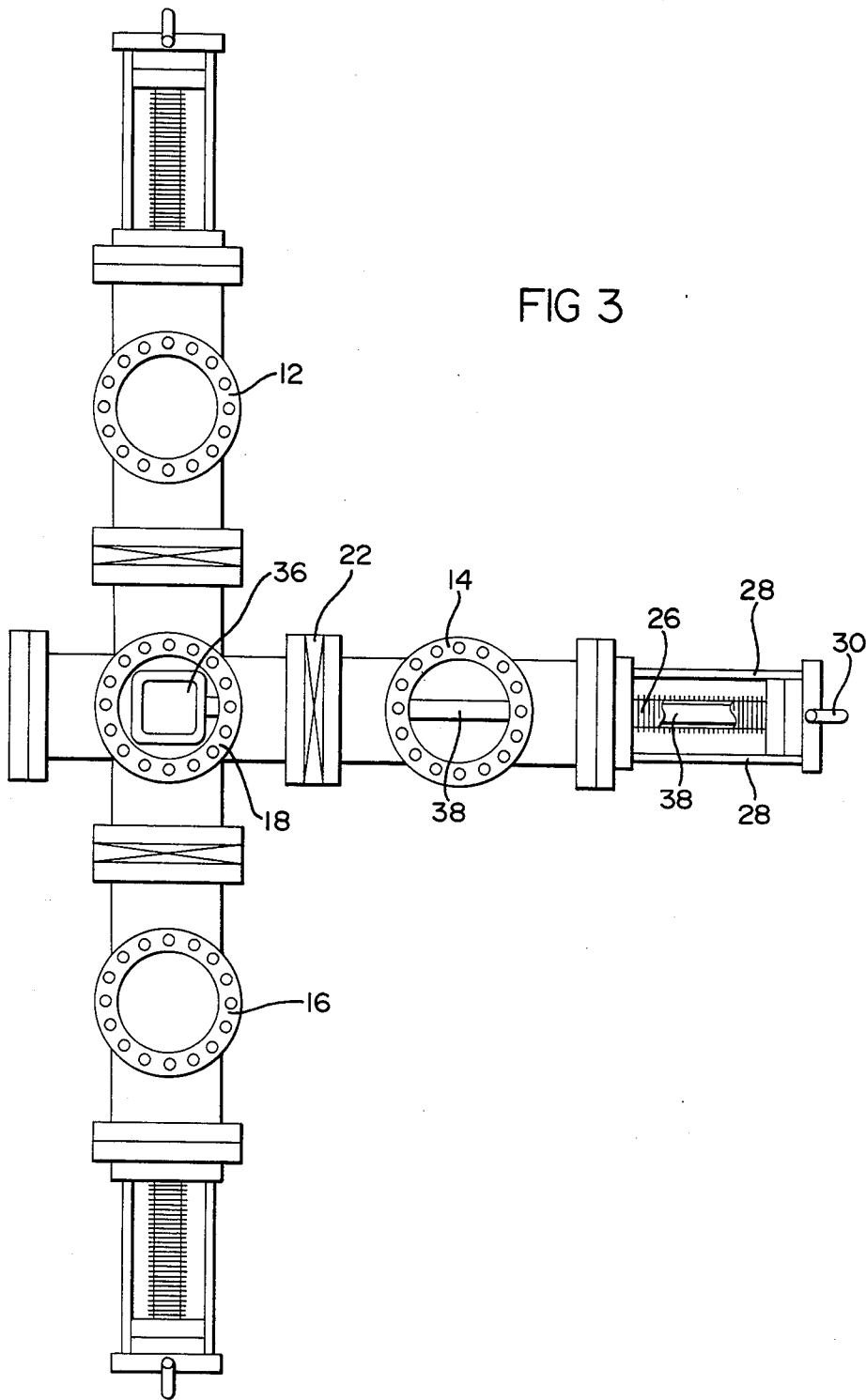
FIG. 3 is a top view of the thin-film deposition apparatus showing partial sectional views illustrating the location of the transport shaft and the substrate carrier.

Referring again to FIG. 2, lever 37 acts to engage and disengage a substrate carrier 36 through mesne mechanisms which are attached to a transport shaft 38 as detailed in FIG. 3.

In its operation, a substrate is placed in the substrate carrier 36 through the top of load lock module 18. Load lock module 18 is then reassembled and evacuated to approximately $10^{-7}$ torr. The desired reactive gas is then flushed into the module, then this gas will be present in deposition chamber 14 during the reaction. After the pressures between load lock 18 and deposition module 14 have been equalized, gate valve 22 is opened and substrate carrier 36 is pulled by transport shaft 38 into deposition module 14. While substrate carrier 36 is located within load lock module 18, lever 30 is activated to engage substrate carrier 36 to transport shaft 38. After the transport mechanism has been pulled into position within deposition module 14, lever 30 is utilized to disengage the substrate carrier from transport shaft 38, allowing the shaft to be fully removed from the deposition module before the deposition occurs. Bellows 26 surrounds transportation transport shaft 38 at all times and seals the shaft from the outside environment. Transport shaft 38 and bellows 26 are supported on rails 28 on the outside of the bellows.

Likewise, the other transportation mechanisms associated with deposition modules 12 and 16 pull the loaded substrate carrier 36 from load lock module 18 into the respective deposition modules for thin-film depositions.

Figure 4:
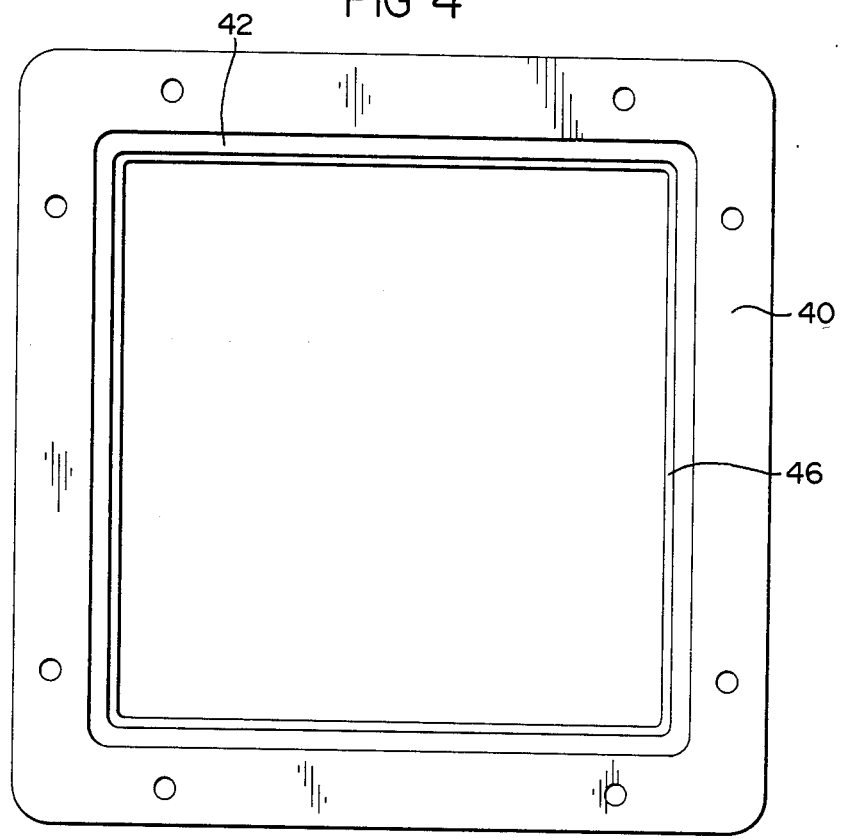
FIG. 4 is a top view of a substrate carrier.
Figure 5:
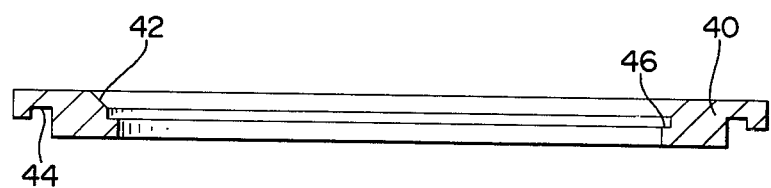
FIG. 5 is a side elevational view of a substrate carrier.

FIGS. 4 and 5 illustrate the substrate carrier. Tray 40 has an opening in the center for its beveled edge 42 leading down to support 46. The substrate itself rests on support 46 and is guided into place by beveled edge 42. The engage/disengage mechanism merely hooks under tray 40 to push and pull the substrate carrier into place.

FIG. 5 illustrates a side view showing groove 44 which rests on transport rails as described hereinabove. Tray 40 is sized for the substrate which is utilized in the present invention. One of ordinary skill in the art would be able to adapt the tray 40 shape to the configuration of any desired substrate.

Figure 6:
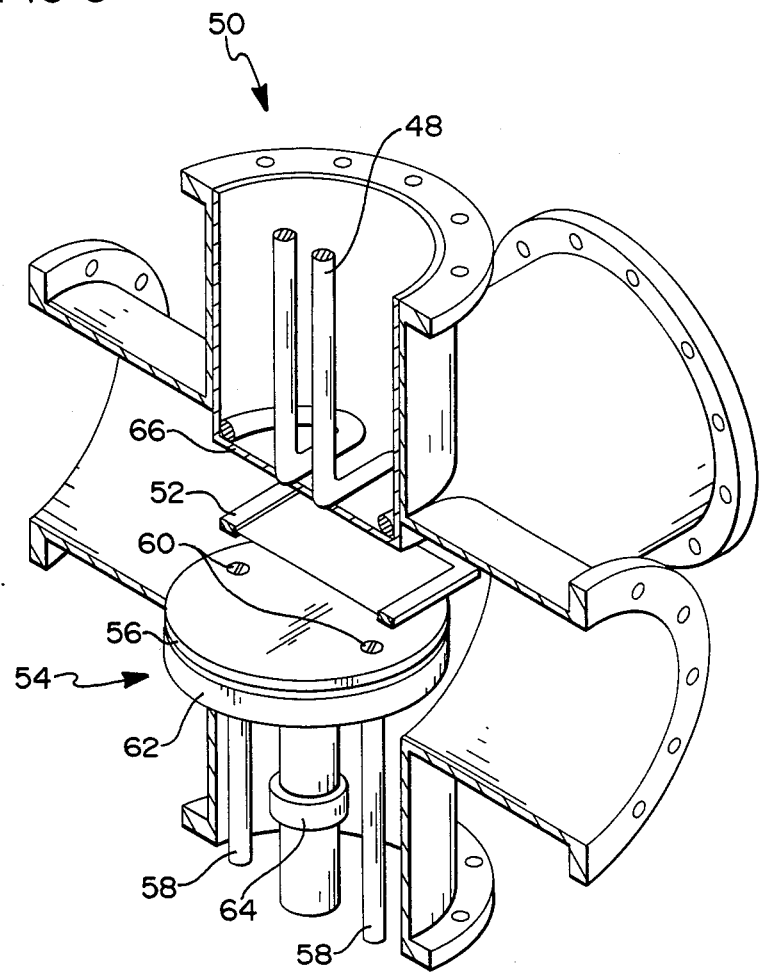
FIG. 6 is an enlarged perspective sectional view illustrating features of the deposition module.

Referring now to FIG. 6, an enlarged perspective sectional is illustrated showing the location of the heater element, the substrate carrier and the RF electrode pedestal within a deposition module. Heater element 48 is located in the top portion of deposition module 50 so that the heater element is in proximity to the substrate in the substrate carrier 52 without being able to outgas into the deposition module 50. RF electrode pedestal 54 includes RF electrode 56 and is attached to pedestal legs 58 by ceramic insulators 60. Pedestal legs 52 extend through grounding plate 62. RF power is brought into the electrode by a co-axial cable located within co-axial cable connector 64. RF electrode pedestal 54 is adapted to allow for a variable distance between the anode, here shown as electrode plate 56, and the cathode, herein shown as grounding plate 62. The distance between these two plates is preselected for the particular reactive gas to be utilized to direct the RF power into the plasma region between the top of RF electrode pedestal 54 and the underside of the substrate in substrate carrier 52. Legs 58 are adjustable in height to bring these two plates closer together or farther apart. Moreover, coaxial cable connector 64 is vacuum compatible and includes coaxial connectors and cables which readily adapt to the variable distances between the anode and the cathode.

Heater element 48 is enclosed in the top of deposition module 50 and is separated from the substrate contained in substrate carrier 52 by an insulator 66. The heating element is in thermal communication with the substrate when the substrate is in position within the deposition module 50. Heater element 48 may be replaced or repaired without taking apart deposition module 50, thereby aiding in the maintenance of the thin-film deposition system itself.

Looking now to FIG. 7, a dark space shield 70 is illustrated surrounding the RF electrode 56. Dark space shield 70 has evenly spaced gas diffuser openings 72 on opposite sides of the dark space shield to urge a preselected pattern of the ingress and egress of reactive gases through the plasma region. Up to 20 evenly spaced circular gas diffuser openings having diameters from about 0.05 inches to about 0.6 inches are in the walls of dark space shield 70. Gas diffuser openings 72 are located on opposite sides of the deposition module proximate the ingress and egress positions for the reactive gases to urge the flowing of gas across the substrate in a preselected pattern perpendicular to the direction of travel of the substrate (shown as direction D) so that a uniform deposition of a material layer onto the substrate is accomplished. The gas diffuser openings 72 prevent jet action by the reactive gas and ensure a more uniform deposition of the thin films.

Referring again to FIG. 7, pin 74 brings the RF power into the electrode to initiate a plasma in the region between the substrate 76 and the RF electrode 56. Ceramic insulator 60 acts to prevent grounding out between the two electrodes, the grounding plate 62 and the RF electrode 56.

Substrate 76 receives its thin-film deposition on its underneath side, the surface closest to the RF electrode 56. After deposition, substrate carrier 52 is shuttled from the deposition module back to the load lock module. Once in the load lock module, the substrate may be transported to any other deposition module desired.

In the instance of the manufacture of photovoltaic cells having a P-I-N configuration, the substrate is first loaded into the load lock, and pulled in the deposition module which is adapted to deposit P-type amorphous silicon thin-films. Then it is transported into the module designed for the deposition of intrinsic amorphous silicon, followed by placing the substrate into the module designed to deposit N-type amorphous silicone. In this way, individual substrates may be processed to produce a photovoltaic device. In the event that a tandem or multi-junction cell is desired, the sequence is merely repeated the number of desired times.

While the best modes for carrying out the invention have herein been described in detail, those familiar with the art to which this invention relates will recognize various alternative designs and embodiments for carrying out the invention as defined by the following claims.

What is claimed is:

1. An apparatus for depositing thin films on a substrate, comprising:
   at least one deposition module capable of maintaining an ultra high vacuum for depositing materials from reactive gases contained therein on a substrate;
   a load lock module capable of maintaining an ultra high vacuum, said load lock connected to said at least one deposition module;
   a gate valve between the deposition module and the load lock to allow the substrate to move from the load lock into the deposition module while minimizing contamination of the reactive gases; and
   a transportation mechanism having a transport shaft and a substrate carrier for moving the substrate between the load lock and said at least one deposition module, said transportation mechanism extending outwardly from the deposition module on the side of the deposition module opposite the load lock whereby the transportation shaft located therein reaches through the deposition module into the load lock to pull the substrate back into the deposition module, said transportation mechanism being adapted to operate within ultra high vacuum conditions so that the substrate can be moved from the load lock into the deposition module without breaking vacuum in the deposition module and contaminating the reactive gases contained therein.

2. An apparatus as in claim 1, wherein said at least one deposition module includes up to four deposition modules, each of said deposition modules perpendicular to the other and each extending outwardly from the load lock module, and further including gate valves associated with each of the deposition modules.

3. An apparatus as in claim 1, wherein said deposition module is a glow discharge chamber for decomposing reactive gases contained therein and depositing a material layer on the surface of the substrate.

4. An apparatus as in claim 1, wherein said deposition module further includes an rf electrode pedestal adapted to allow for a variable distance between an anode and a cathode within said deposition module, said distance being preselected for the particular reactive gas to be utilized.

5. An apparatus as in claim 4, wherein said rf electrode pedestal further includes vacuum compatible coaxial connectors and cables which readily adapt to the variable distances between the anode and the cathode.

6. An apparatus as in claim 1, further comprising a heating element outside the vacuum portion of the deposition module, said heating element being separated from the vacuum portion of the deposition module by an insulator and said heating element being in thermal communication with the substrate when the substrate is in position within the deposition module.

7. An apparatus as in claim 1, further comprising a dark space shield having evenly spaced gas diffuser openings on opposite sides of the dark space shield to urge a preselected pattern of the ingress and egress of reactive gases therethrough.

8. An apparatus as in claim 7, wherein the dark space shield further includes up to twenty evenly spaced circular gas diffuser openings having diameters of from about 0.05 inches to about 0.6 inches in the wall of the dark space shield, said gas diffuser openings being located on opposite sides of the deposition module proximate the ingress and egress positions for the reactive gases to urge the flowing of gas across the substrate in a preselected pattern perpendicular to the direction of travel of the substrate so that a uniform deposition of a material layer onto the substrate is accomplished.

9. An apparatus as in claim 1, wherein said ultra high vacuum maintained within the apparatus includes pressures less than or equal to about $10^{-7}$ torr.

10. An apparatus as in claim 1, wherein said at least one deposition module is adapted for the thin film deposition of P-type amorphous silicon material onto a substrate contained therein.

11. An apparatus as in claim 1, wherein said at least one deposition module is adapted for the thin film deposition of intrinsic amorphous silicon material onto a substrate contained therein.

12. An apparatus as in claim 1, wherein said at least one deposition module is adapted for the thin film deposition of N-type amorphous silicon material onto a substrate contained therein.

13. An apparatus as in claim 1, wherein said load lock module further includes at least one opening in the wall of the load lock module connecting the interiors of the load lock module and the at least one deposition module through the gate valve to allow passage of the substrate.

14. An apparatus as in claim 1, wherein said transportation mechanism further includes ultra high vacuum compatible bellows surrounding and sealing the transportation mechanism.

15. An apparatus as in claim 14, wherein said transportation mechanism further includes a transport rail supporting the substrate carrier and connectable to the transport shaft located within the bellows under vacuum conditions for transporting the substrate along said transport rail between the load lock and the deposition module while remaining under vacuum.

16. An apparatus as in claim 1, wherein said transportation mechanism further includes a motor driven gear drive means for supporting the substrate carrier and for moving the transport shaft into and out of the load lock module and the deposition module.

17. An apparatus as in claim 1, wherein said transportation mechanism further includes a manually operated means for moving the transport shaft into and out of the load lock module and the deposition module.

18. An apparatus for depositing thin films on a substrate, comprising:
   a first deposition module capable of maintaining an ultra high vacuum for a glow discharge deposition of P-type amorphous silicon material by the decomposition of at least one gas contained therein on the surface of the substrate;

a second deposition module capable of maintaining an ultra high vacuum for a glow discharge deposition of intrinsic amorphous silicon material from the decomposition of at least one gas contained therein on the surface of a substrate;

a third deposition module capable of maintaining an ultra high vacuum for a glow discharge deposition of N-type amorphous silicon material from the decomposition of at least one gas on the surface of the substrate;

a central load lock module capable of maintaining an ultra high vacuum, said load lock connected to said first, second and third deposition modules;

a first gate valve connected to and located between said first deposition module and the central load lock module to minimize cross-contamination;

a second gate valve connected to and located between the second deposition module and the central load lock to minimize cross-contamination;

a third gate valve connected to and located between the third deposition module and the central load lock module to minimize cross-contamination;

a first bellows-sealed, manually operated transportation mechanism for moving the substrate between the central load lock and the first deposition module, said first transportion mechanism being adapted to operate within ultra high vacuum conditions and extending outwardly from the first deposition module on the side of the deposition module opposite the central load lock whereby the transportation shaft located therein reaches through the first deposition module into the central load lock to pull the substrate back into the deposition module;

a second bellows-sealed, manually operated transportation mechanism for moving the substrate between the central load lock and the second deposition module, said second transportation mechanism being adapted to operate within ultra high vacuum conditions and extending outwardly from the second deposition module on the side of the deposition module opposite the central load lock whereby the transportation shaft located therein reaches through the second deposition module into the central load lock to pull the substrate back into the deposition module; and a third bellows-sealed, manually operated transportation mechanism for moving the substrate between the central load lock and the third deposition module, said third transportation mechanism being adapted to operate within ultra high vacuum conditions and extending outwardly from the third deposition module on the side of the deposition module opposite the central load lock whereby the transportation shaft located therein reaches through the third deposition module into the central load lock to pull the substrate back into the deposition module.

* * * * *

UNITED STATES PATENT AND TRADEMARK OFFICE
CERTIFICATE OF CORRECTION

PATENT NO. : 4,763,602
DATED : August 16, 1988
INVENTOR(S) : Arun Madan & Bolko Von Roedern It is certified that error appears in the above-identified patent and that said Letters Patent is hereby corrected as shown below:

In column 7, line 10, please delete the word "silicone" and insert in its place the word ---silicon---.

Signed and Sealed this

Twenty-third Day of May, 1989

*Attest:*

DONALD J. QUIGG

*Attesting Officer*      *Commissioner of Patents and Trademarks*